(12) United States Patent
Tanuma et al.

(10) Patent No.: US 9,929,135 B2
(45) Date of Patent: Mar. 27, 2018

(54) APPARATUSES AND METHODS FOR SEMICONDUCTOR CIRCUIT LAYOUT

(71) Applicant: Micron Technology, Inc., Boise, ID (US)

(72) Inventors: Yasuhiko Tanuma, Tokyo (JP); Takashi Ishihara, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/063,117

(22) Filed: Mar. 7, 2016

(65) Prior Publication Data

US 2017/0256529 A1    Sep. 7, 2017

(51) Int. Cl.
*H01L 29/49* (2006.01)
*H01L 27/02* (2006.01)
*H01L 27/06* (2006.01)
*G06F 17/50* (2006.01)

(52) U.S. Cl.
CPC ...... *H01L 27/0207* (2013.01); *G06F 17/5072* (2013.01); *H01L 27/0629* (2013.01)

(58) Field of Classification Search
CPC ............ H01L 27/0207; H01L 27/0629; G02F 17/5072
See application file for complete search history.

(56) References Cited

U.S. PATENT DOCUMENTS

2009/0091027 A1*  4/2009  Fan ...................... H01L 25/105
                                                     257/737

* cited by examiner

*Primary Examiner* — Michael Shingleton
(74) *Attorney, Agent, or Firm* — Dorsey & Whitney LLP (57) ABSTRACT

Apparatuses including circuit layout regions of a semiconductor device and methods of designing the circuit layout regions of a semiconductor device are described. An example apparatus includes a first layout region including a first transistor area including at least one first transistor, at least one contact in proximity to the first transistor area, and a first resistor area comprising at least one first resistor coupled to the at least one first transistor. The first transistor area and the at least one contact are aligned in a first direction, and the first transistor area and the first resistor area are aligned in a second direction. The second direction may be substantially perpendicular to the first direction. The at least one contact may be one of a substrate contact and a well contact.

16 Claims, 10 Drawing Sheets

APPARATUSES AND METHODS FOR SEMICONDUCTOR CIRCUIT LAYOUT

BACKGROUND

High data reliability, high speed of memory access, and reduced chip size are features that are demanded from semiconductor memory.

In recent years, there has been an effort to reduce a chip size for semiconductor devices. As part of that effort to reduce the chip size, reduction of a logic circuit area through layout optimization has been playing an important role as well as area reduction through improved microfabrication processes.

Generally, a layout of the area for logic circuits includes one or more standard cells. A standard cell is a small-scale circuit unit including a group of at least one transistor and interconnect structures with a standardized constant width. The standard cell may provide a logic function or a storage function. Typically, the standard cell provides a substrate contact (sub-contact) for an n-channel transistor and a well-contact for a p-channel transistor within the standard cell in order to supply the transistor in the standard cell with a stable bulk voltage. Because standard cells arrangement allows various combinations of standard cell types next to each other in the area for logic circuits, standard cells are designed to provide the sub-contact and well-contact without fail regardless of adjacent standard cell type combinations.

A delay circuit includes a capacitance and a resistance on a signal line and provides a delay. Typically, a delay circuit that may be provided as a standard cell includes an inverter, a resistance element, and a capacitive element. The delay circuit occupies a relatively large area for at least two reasons. First, space tends to be created in an area adjacent to the resistance element or an area adjacent to the transistor due to a difference in area between the resistance element and the transistor. Second, the resistance element may be surrounded by any sub-contact or well-contact included in the standard cell. Thus, reducing the space as well as the number of sub-contacts and well-contacts adjacent to the resistance element may be desired for the area reduction of the delay circuit.

DETAILED DESCRIPTION OF PREFERRED EMBODIMENTS

Various embodiments of the present disclosure will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structure, logical and electrical changes may be made without departing from the scope of the present invention. The various embodiments disclosed herein are not necessary mutually exclusive, as some disclosed embodiments can be combined with one or more other disclosed embodiments to form new embodiments.

Figure 1A:
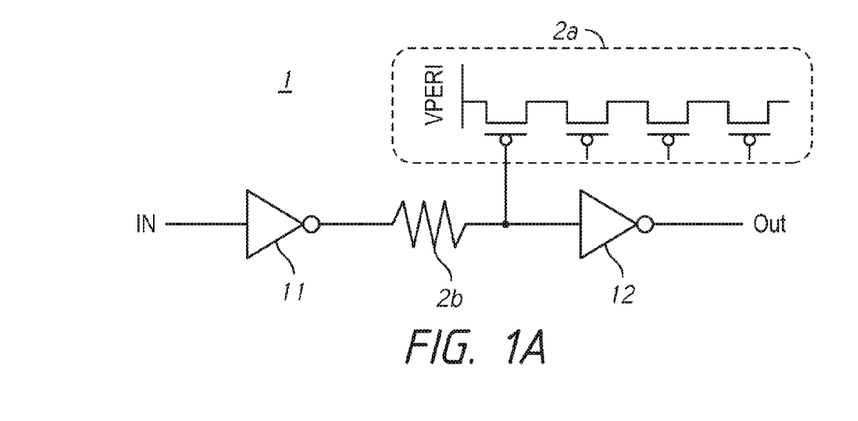
FIG. 1A is a circuit diagram of an example of a delay circuit.
Figure 1B:
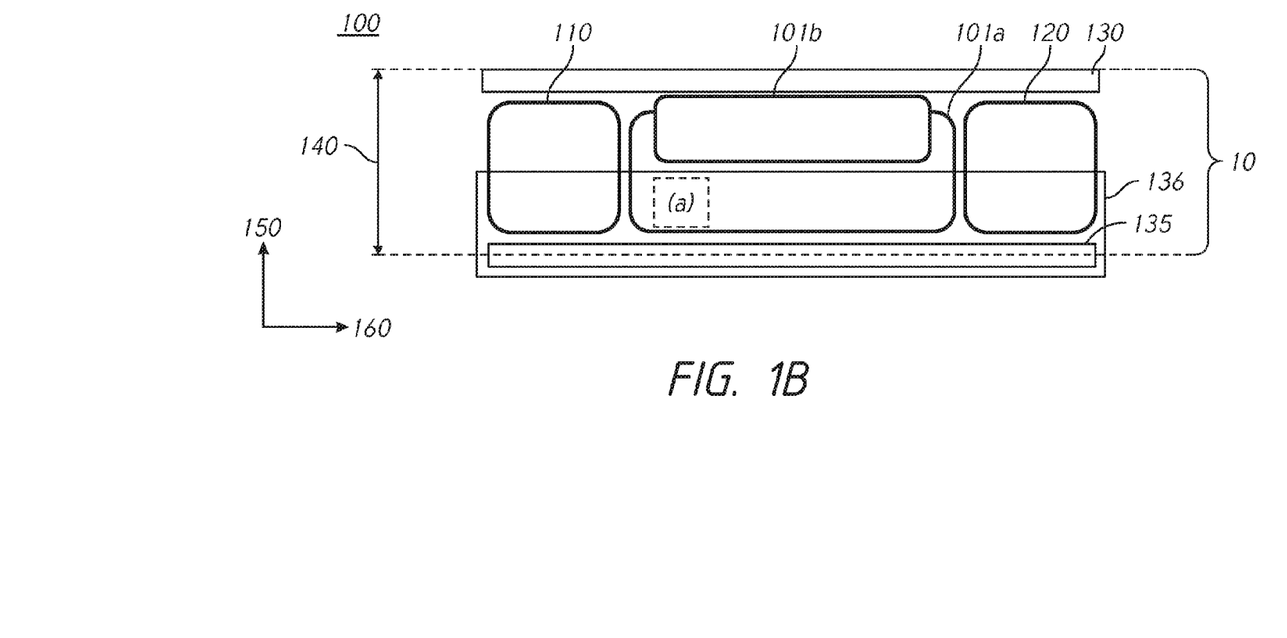
FIG. 1B is a simplified layout diagram of the example of the delay circuit including standard cells.

FIG. 1A is a circuit diagram of an example of a delay circuit 1. The delay circuit 1 includes inverters 11 and 12, a plurality of transistors 2a which functions as a capacitor and a resistor 2b. FIG. 1B is a simplified layout diagram of the example of the delay circuit including standard cells. The delay circuit 100 may be used as the delay circuit 1 in FIG. 1A, which is fabricated on a substrate that has a first conductivity type. A substrate contact (sub-contact) area 130 is of the first conductivity type. A substrate voltage is applied to the substrate through the sub-contact area 130. A well region 136, disposed in the substrate, is of a second conductivity type that is different from the first conductivity type. A well-contact area 135 is of the second conductivity type. A well voltage is applied to the well region 136 through the well-contact area 135. A layout region 10 with a first width 140 in a first direction 150 extends in a second direction 160. The layout region 10 includes the sub-contact area 130 and the well-contact area 135. The delay circuit 100 includes at least one logic circuit in a transistor area 101a and a resistive element in a resistor area 101b. For example, the transistor area 101a may correspond with the plurality of transistors 2a in FIG. 1A and the resistive element in the resistor area 101b may correspond with the resistor 2b in FIG. 1A. The logic circuit is electrically coupled to the resistive element. The sub-contact area 130 is a contact area that may have a line-shaped active area extending in the second direction 160. The active area is a diffusion layer that has high concentration of an impurity for the same conductivity type as the substrate (it may be a well-region that has the same conductivity type as the substrate). The well-contact area 135 is a contact area that may have a line-shaped active area extending in the second direction 160. The active area is a diffusion layer that has high concentration of impurity for the same conductivity type as the well region 136 (e.g., an N-well region). The width 140 of the layout region 10 is defined by the sub-contact area 130 and the well-contact area 135 in the first direction 150. Each of the well-contact area 135 and the sub-contact area 130 may be shared with one of adjacent layout regions of the layout region 10. The well region 136 may extend over the layout region 10 and may also be shared with one of adjacent layout regions of the layout region 10. Thus, the well-contact area 135 disposed in the well region 136 may be shared with one of adjacent layout regions of the layout region 10. Standard cells 110 and 120 as peripheral circuit blocks are arranged within the layout region 10. For example, the standard cells 110 and 120 that may be inverters 11 and 12 of FIG. 1A are aligned to each other between the sub-contact area 130 and the well-contact area 135 along the second direction 160. The resistor area 101b may be defined in the width 140 in the first direction 150. The resistor area 101b may be located on a side of the 101a that is opposite of the side of 101a that is nearer the well-contact area 135.

Figure 2:
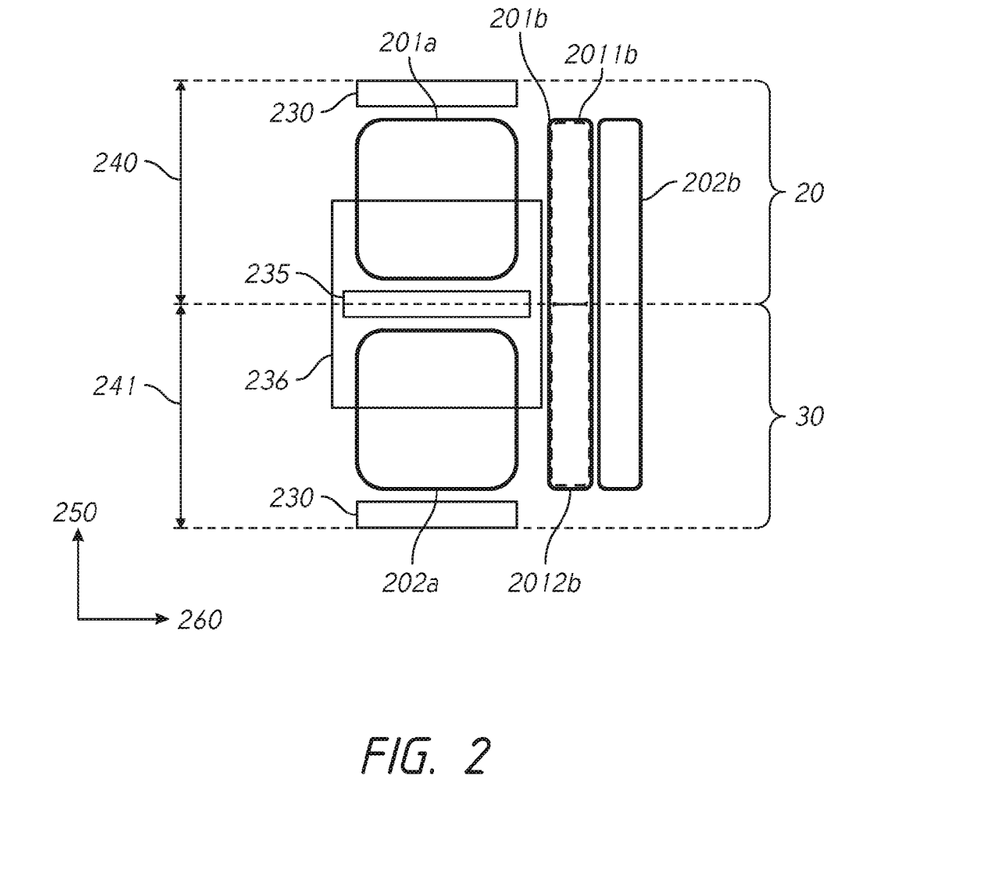
FIG. 2 is a simplified layout diagram of logic circuits in accordance with an embodiment of the present disclosure.

FIG. 2 is a simplified layout diagram of logic circuits in accordance with an embodiment of the present disclosure. A first layout region 20 and a second layout region 30 may be circuit layout regions that are adjacent to each other in a first direction 250. The first layout region 20 and the second layout region 30 extend in a second direction 260 with a first width 240 and a second width 241, respectively. The second direction 260 may be substantially perpendicular to the first direction 250. In this example, the first layout region 20 and the second layout region 30 share a well-contact area 235 on a side shared by the first layout region 20 and the second layout region 30. In this manner, the well-contact area 235 extending in the second direction 260 may be shared by two adjacent layout regions. A well region 236 extends across a portion of the first layout region 20 and across a portion of the second layout region 30. Each of the first layout region 20 and the second layout region 30 includes a sub-contact area 230 extending in the second direction on sides opposite the side shared by the first layout region 20 and the second layout region 30. A first transistor area 201a is in the first layout region 20 and a second transistor area 202a is in the second layout region 30. The transistor areas 201a and 202a and the well-contact area 235 are adjacent to each other in an area defined by the sub-contact area 230 and the well-contact area 235 along the first direction 250 in a manner that the well-contact area 235 is located between the transistor areas 201a and 202a and is shared by the transistor areas 201a and 202a. A first logic circuit in the transistor area 201a is electrically coupled to a first resistive element in a first resistor area 201b. A second logic circuit in the second transistor area 202a is electrically coupled to a second resistive element in a second resistor area 202b. In this example, the first resistor area 201b and the second resistor area 202b are aligned to each other along the second direction 260 and extend across a portion of the first layout region 20 and a portion of the second layout region 30 in the first direction 250. In this example, the resistor area includes a first portion 2011b and a second portion 2012b and includes the first resistive element that extends continuously from the first portion 2011b to the second portion 2012b in the first direction 250. The first portion 2011b and the second portion 2012b are adjacent respectively to the first transistor area 201a and the second transistor area 202a along the second direction 260 that is substantially perpendicular to the first direction 250. In this example, the first resistor area 201b and the second resistor area 202b are disposed in an adjacent area outside of an area defined by the sub-contact area 230 and the well-contact area 235, because the second direction 260 is substantially perpendicular to the first direction 250. In some embodiments, the first transistor area 201a may include a plurality of transistors. The plurality of transistors may be configured as the first logic circuit. Similarly, the second transistor area may include a plurality of transistors. The plurality of transistors may be configured as the second logic circuit. In one embodiment, the first transistor area 201a may be a first complementary metal-oxide semiconductor (CMOS) area including a plurality of first channel type transistors (e.g., n-channel transistors). The second transistor area 202a may be a second CMOS area including a plurality of second channel type transistors (e.g., p-channel transistors) shown as the plurality of transistors 2a in FIG. 1A. However, alternative transistor areas may be assigned to these channel types.

Figure 3A:
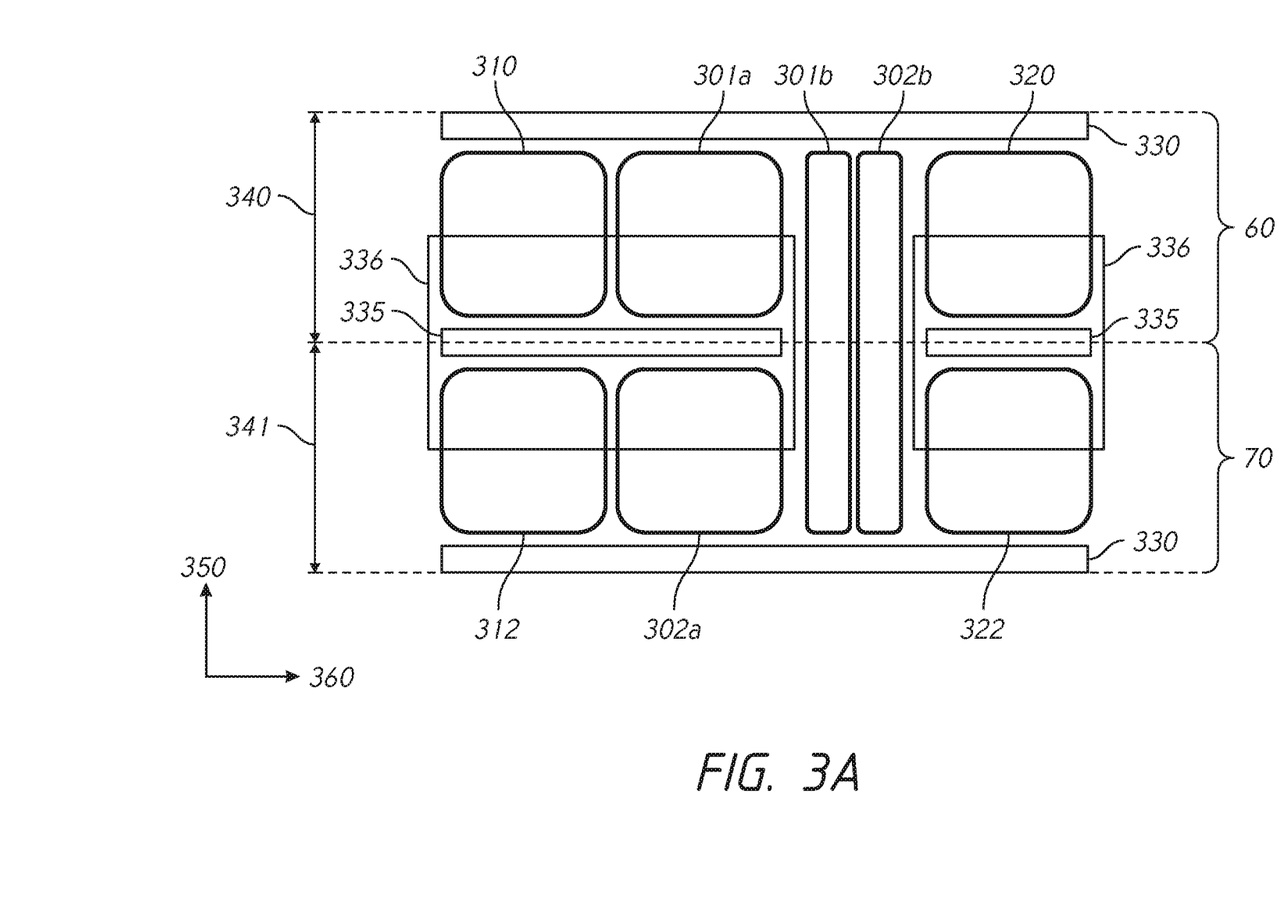
FIGS. 3A-3E are simplified layout diagrams of logic circuits including circuit cells in accordance with an embodiment of the present disclosure.

FIG. 3A is a simplified layout diagram of logic circuits including circuit cells in accordance with an embodiment of the present disclosure. A first layout region 60 and a second layout region 70 are adjacent to each other in a first direction 350. The first layout region 60 and the second layout region 70 extend in a second direction 360 with a first width 340 and a second width 341, respectively. The second direction 360 may be substantially perpendicular to the first direction 350. In this example, the first layout region 60 and the second layout region 70 share a well-contact area 335 on a side shared by the first layout region 60 and the second layout region 70. In this manner, the well-contact area 335 may be shared by two adjacent layout regions. A well region 336 extends across a portion of the first layout region 60 and across a portion of the second layout region 70. Each of the first layout region 60 and the second layout region 70 includes a sub-contact area 330 at sides opposite the side shared by the first layout region 60 and the second layout region 70. A first transistor area 301a and peripheral circuit blocks in circuit cells 310 and 320 are in the first layout region 60. A transistor area 302a and peripheral circuit blocks in circuit cells 312 and 322 are in the second layout region 70. The transistor areas 301a and 302a are disposed in the first and the second layout regions 60 and 70, respectively, along the first direction 350 across the well-contact area 335 in order to share the well-contact area 335. A first delay circuit includes a first logic circuit in the first transistor area 301a and a first resistive element in a first resistor area 301b. The first logic circuit is electrically coupled to the first resistive element. A second delay circuit includes a second logic circuit disposed in the second transistor area 302a and a second resistive element in a second resistor area 302b. The second logic circuit is electrically coupled to the second resistive element. In one embodiment, the first delay circuit and the second delay circuit may be the delay circuit 1 of FIG. 1A. In this example, the first resistor area 301b and the second resistor area 302b, being adjacent to each other and aligned to each other along the second direction 360, extend across the first layout region 60 to the second layout region 70 in the first direction 350. In this example, the first resistor area 301b and the second resistor area 302b are disposed outside of an area defined by the sub-contact area 330 and the well-contact area 335.

Figure 3B:
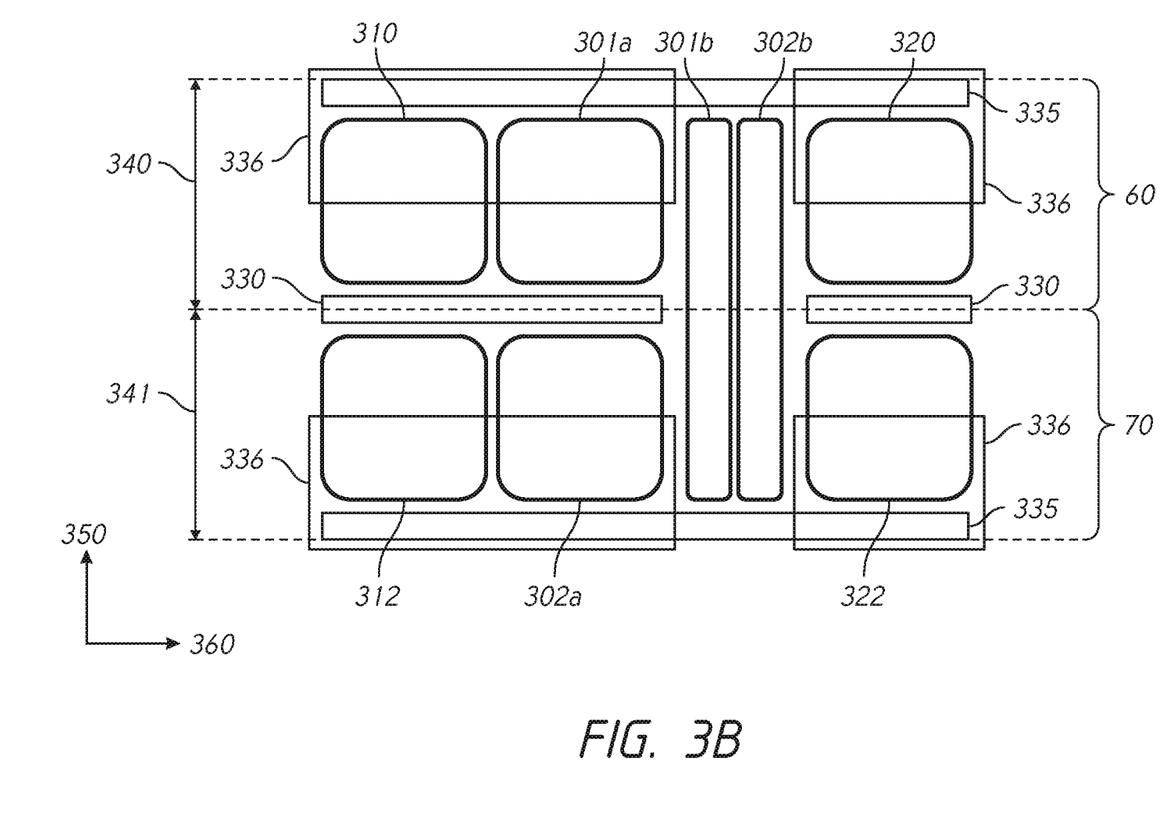

FIG. 3B is a simplified layout diagram of logic circuits including circuit cells in accordance with an embodiment of the present disclosure. Description of components corresponding to components included in FIG. 3A will not be repeated and changes from FIG. 3A including positional relationships between the components will be described. In this example, the first layout region 60 and the second layout region 70 share a sub-contact area 330 on a side shared by the first layout region 60 and the second layout region 70. In this manner, the sub-contact area 330 may be shared by two adjacent layout regions. Each of the first layout region 60 and the second layout region 70 includes a well-contact area 335 in a well region 336 at sides opposite the side shared by the first layout region 60 and the second layout region 70. A first transistor area 301a and peripheral circuit blocks in circuit cells 310 and 320 are in the first layout region 60. A transistor area 302a and peripheral circuit blocks in circuit cells 312 and 322 are in the second layout region 70. The first transistor area 301a and the second transistor area 302a are disposed in the first and the second layout regions 60 and 70, respectively, along the first direction 350 across the sub-contact area 330 in order to share the sub-contact area 330. A first delay circuit includes a first logic circuit in the first transistor area 301a and a first resistive element in a first resistor area 301b. The first logic circuit is electrically coupled to the first resistive element. A second delay circuit includes a second logic circuit disposed in the second transistor area 302a and a second resistive element in a second resistor area 302b. The second logic circuit is electrically coupled to the second resistive element. In this example, the first resistor area 301b and the second resistor area 302b, aligned to each other along the second direction 360, extend across the first layout region 60 to the second layout region 70 in the first direction 350. In this example, the first resistor area 301b and the second resistor area 302b are disposed outside of an area defined by the sub-contact area 330 and the well-contact area 335.

Figure 3C:
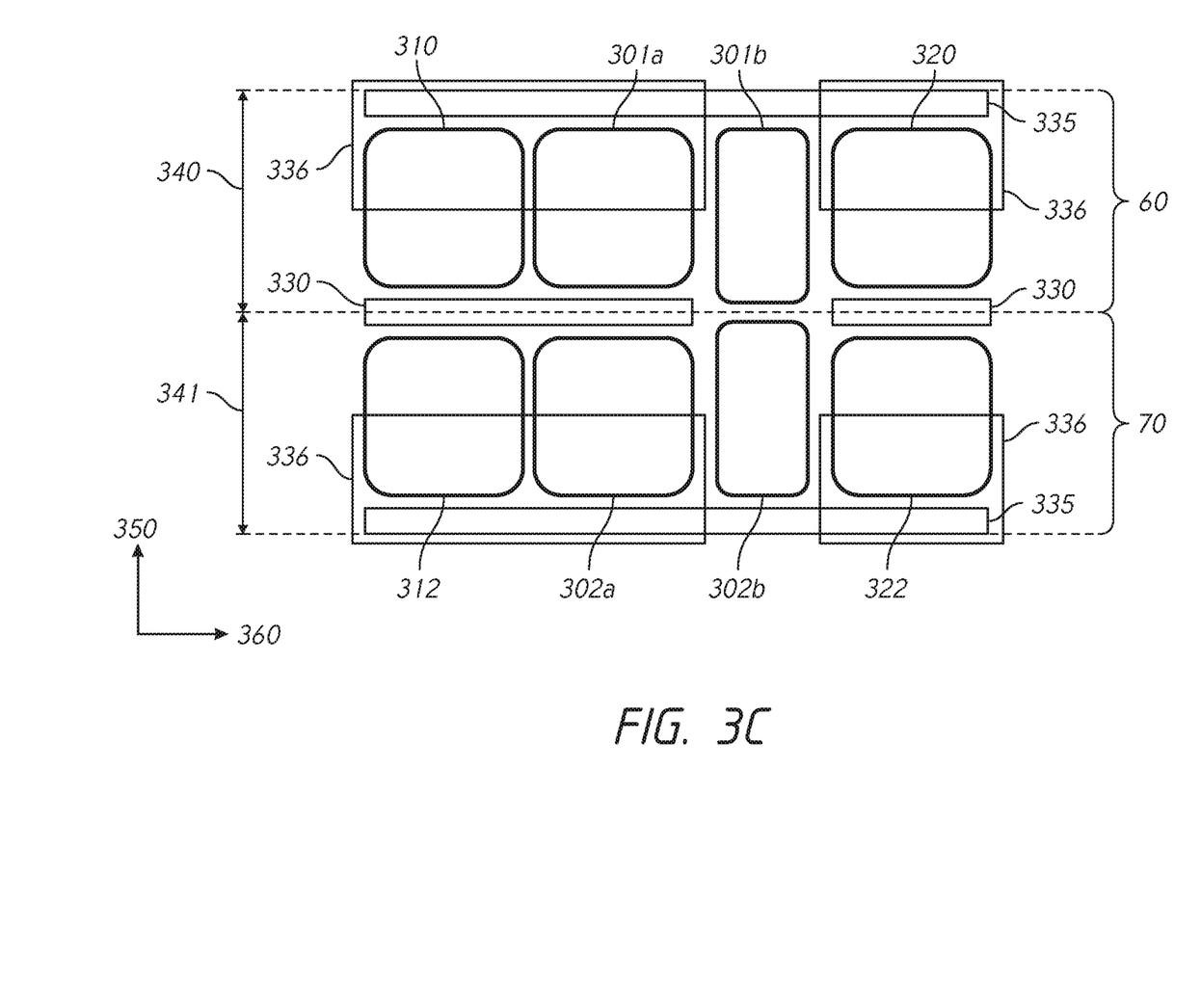

FIG. 3C is a simplified layout diagram of logic circuits including circuit cells in accordance with an embodiment of the present disclosure. Description of components corresponding to components included in FIG. 3B will not be repeated and changes from FIG. 3B including positional relationships between the components will be described. In this example, the first resistor area 301b and the second resistor area 302b, aligned to each other, are disposed in the first layout region 60 to the second layout region 70 in the first direction 350, respectively. The first resistor area 301b and the second resistor area 302b are adjacent to each other disposed outside of an area defined by the sub-contact area 330 and the well-contact area 335.

Figure 3D:
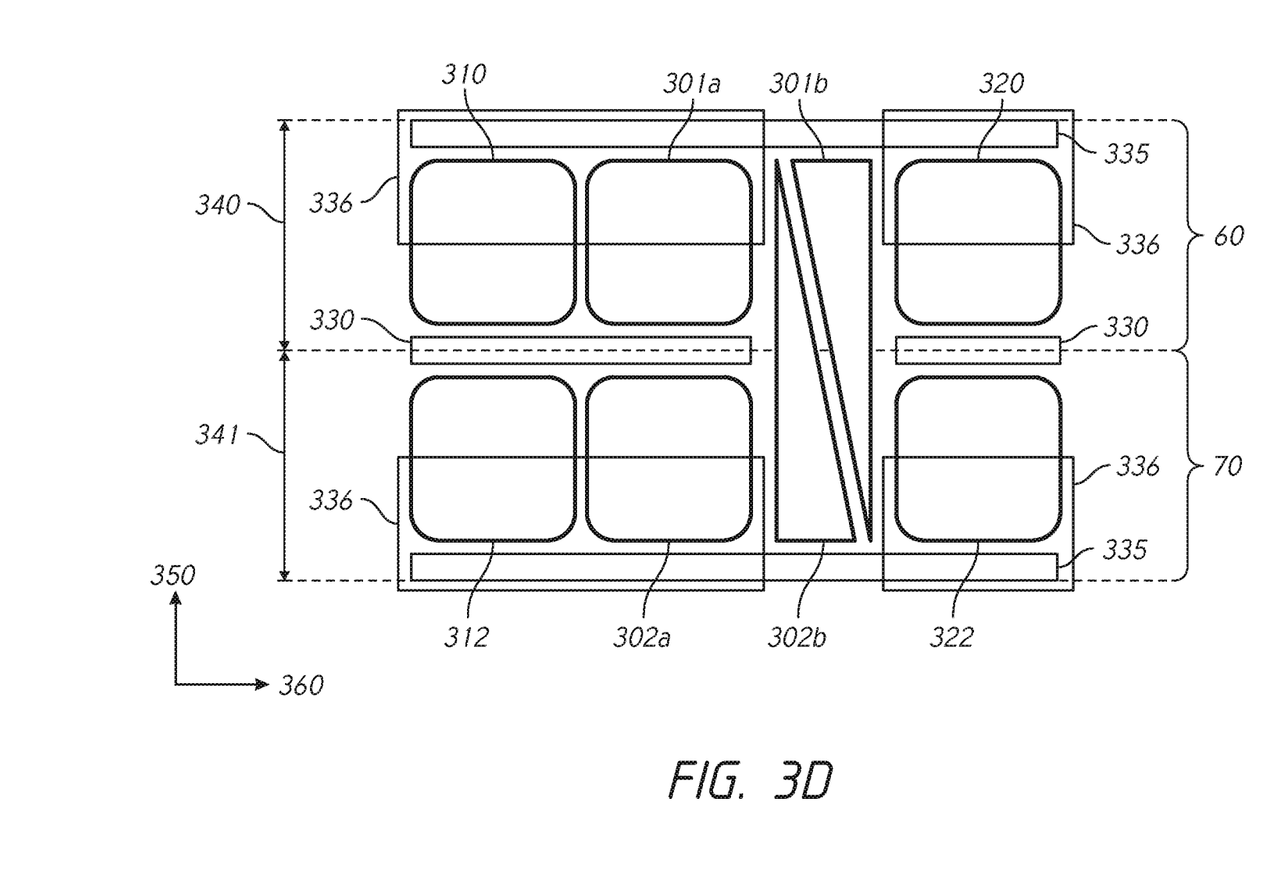

FIG. 3D is a simplified layout diagram of logic circuits including circuit cells in accordance with an embodiment of the present disclosure. Description of components corresponding to components included in FIG. 3B will not be repeated and changes from FIG. 3B including positional relationships between the components will be described. In this example, the first resistor area 301b and the second resistor area 302b both have shapes across the first layout region 60 to the second layout region 70. The first resistor area 301b and the second resistor area 302b are adjacent to each other, disposed outside of an area defined by the sub-contact area 330 and the well-contact area 335.

Figure 3E:
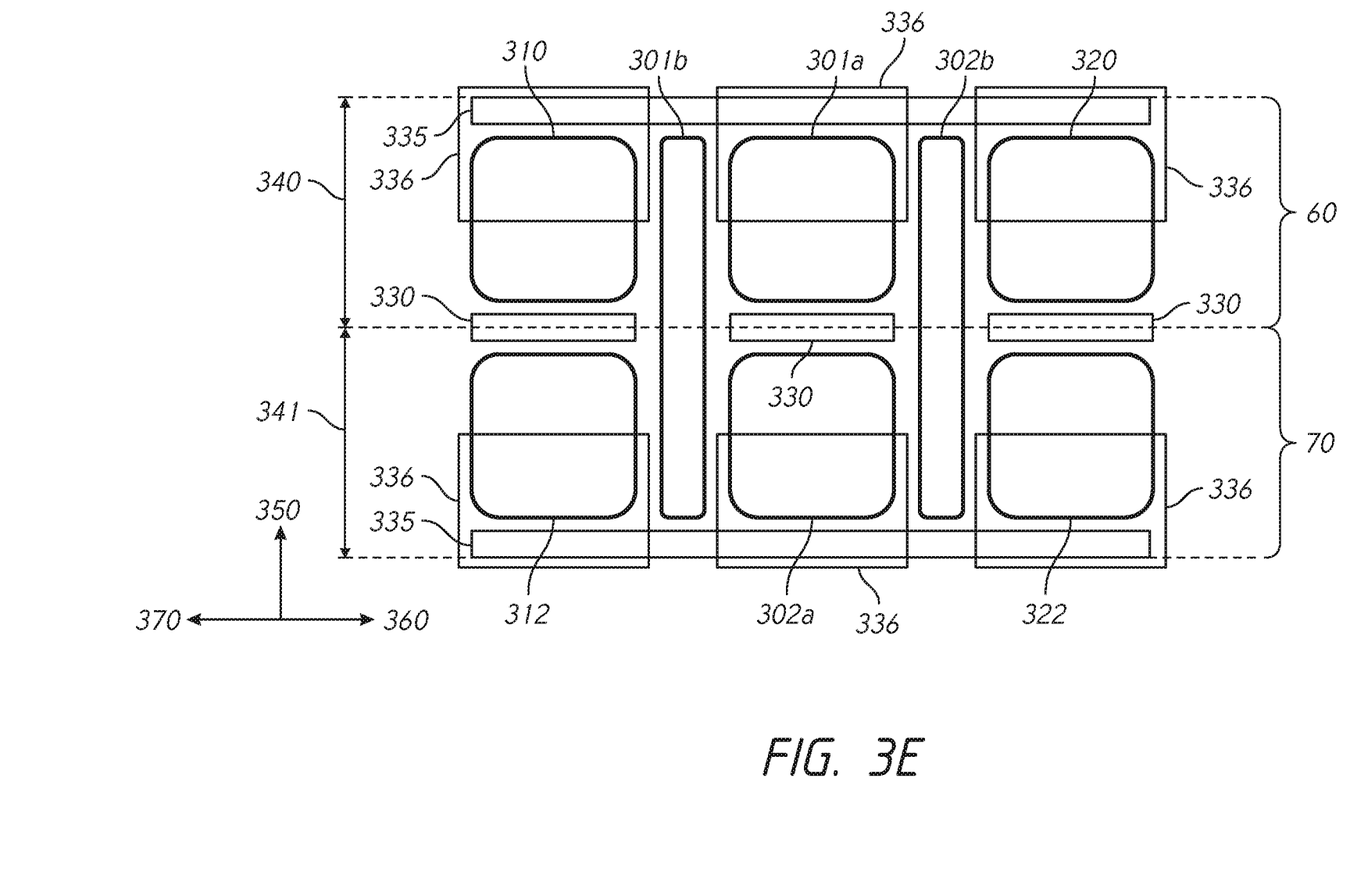

FIG. 3E is a simplified layout diagram of logic circuits including circuit cells in accordance with an embodiment of the present disclosure. Description of components corresponding to components included in FIG. 3B will not be repeated and changes from FIG. 3B including positional relationships between the components will be described. In this example, the first resistor area 301b is disposed adjacent to the first transistor area 301a and the second transistor area 302a along a third direction which is substantially opposite to the second direction 360. The second resistor area 302b is disposed adjacent to the first transistor area 301a and the second transistor area 302a along the second direction 360. The first resistor area 301b and the second resistor area 302b may extend across a portion of the first layout region 60 and across the second layout region 70. In this example, the first resistor area 301b and the second resistor area 302b are disposed outside of an area defined by the sub-contact area 330 and the well-contact area 335.

Figure 4:
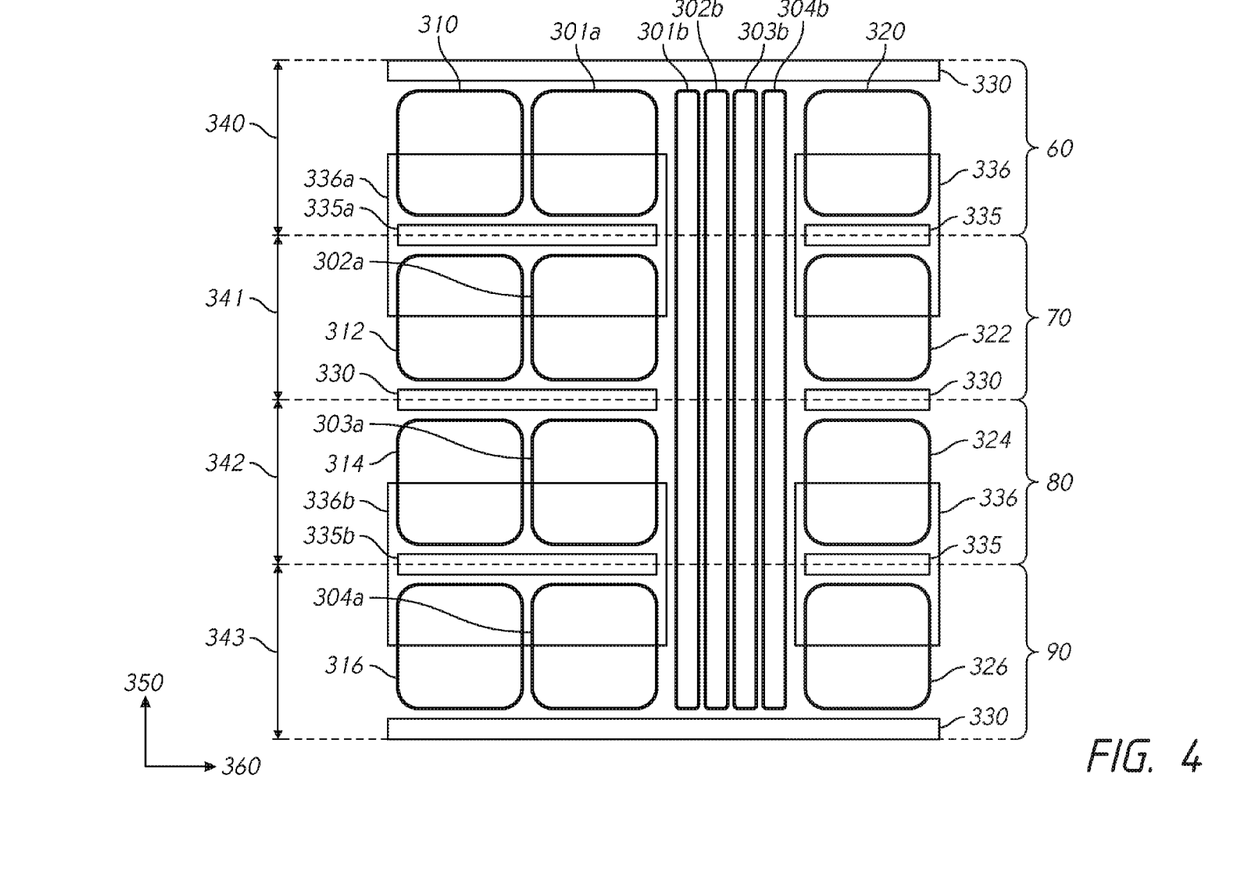
FIG. 4 is a simplified layout diagram of logic circuits including circuit cells in accordance with an embodiment of the present disclosure.

FIG. 4 is a simplified layout diagram of logic circuits including circuit cells in accordance with an embodiment of the present disclosure. For example, a first layout region 60, a second layout region 70, a third layout region 80 and a fourth layout region 90 extend in the second direction 360 with a first width 340, a second width 341, a third width 342 and a fourth width 343 in the first direction 350, respectively. In this example, the first layout region 60 and the second layout region 70 share one well-contact area 335a in a well region 336a, the third layout region 80 and the fourth layout region 90 share another well-contact area 335b in another well region 336b, and the second layout region 70 and the third layout region 80 share a sub-contact area 330. In this manner, sub-contact areas and well-contact areas may be shared by two adjacent layout regions. The well region 336a extends across a portion of the first layout region 60 and across a portion of the second layout region 70 and the well region 336b extends across a portion of the third layout region 80 and across a portion of the fourth layout region 90. A first transistor area 301a and peripheral circuit blocks in circuit cells 310 and 320 are in the first layout region 60 aligned in the second direction 360. A second transistor area 302a and peripheral circuit blocks in circuit cells 312 and 322 are aligned to each other in the second layout region 70. A transistor area 303a and peripheral circuit blocks in circuit cells 314 and 324 are aligned to each other in the third layout region 80. A fourth transistor area 304a and peripheral circuit blocks in circuit cells 316 and 326 are in the fourth layout region 90 and adjacent to each other along the second direction 360. The transistor areas 301a and 302a are adjacent to each other along the first direction 350 across the well-contact area 335a. The transistor areas 302a and 303a are adjacent to each other along the first direction 350 across the sub-contact area 330. The transistor areas 303a and 304a are adjacent to each other along the first direction 350 across the well-contact area 335b. Thus, sub-contact areas and well-contact areas may be shared by adjacent transistor areas of adjacent layout regions.

A first delay circuit includes a first logic circuit in the first transistor area 301a and a first resistive element in a first resistor area 301b electrically coupled to the first logic circuit. A second delay circuit includes a second logic circuit in the second transistor area 302a and a second resistive element in a second resistor area 302b electrically coupled to the second logic circuit. A third delay circuit includes a third logic circuit in the third transistor area 303a and a third resistive element in a third resistor area 303b electrically coupled to the third logic circuit. A fourth delay circuit includes a fourth logic circuit in the fourth transistor area 304a and a fourth resistive element in a fourth resistor area 304b electrically coupled to the fourth logic circuit. In this example, the first resistor area 301b, the second resistor area 302b, the third resistor area 303b and the fourth resistor area 304b extend across the first layout region 60, the second layout region 70, the third layout region 80 and the fourth layout region 90. The first resistor area 301b, the second resistor area 302b, the third resistor area 303b and the fourth resistor area 304b may be aligned between the sub-contact area 330 in the first layout region 60 and the sub-contact area 330 in the fourth layout region 90 along the second direction 360, The transistor areas 301a, 302a, 303a and 304a in the first layout region 60, the second layout region 70, the third layout region 80 and the fourth layout region 90 respectively, are disposed along the first direction 350. In this example, the first resistor area 301b, the second resistor area 302b, the third resistor area 303b and the fourth resistor area 304b are outside of an area defined by the well-contact areas 335a, 335b and the sub-contact area 330.

Figure 5A:
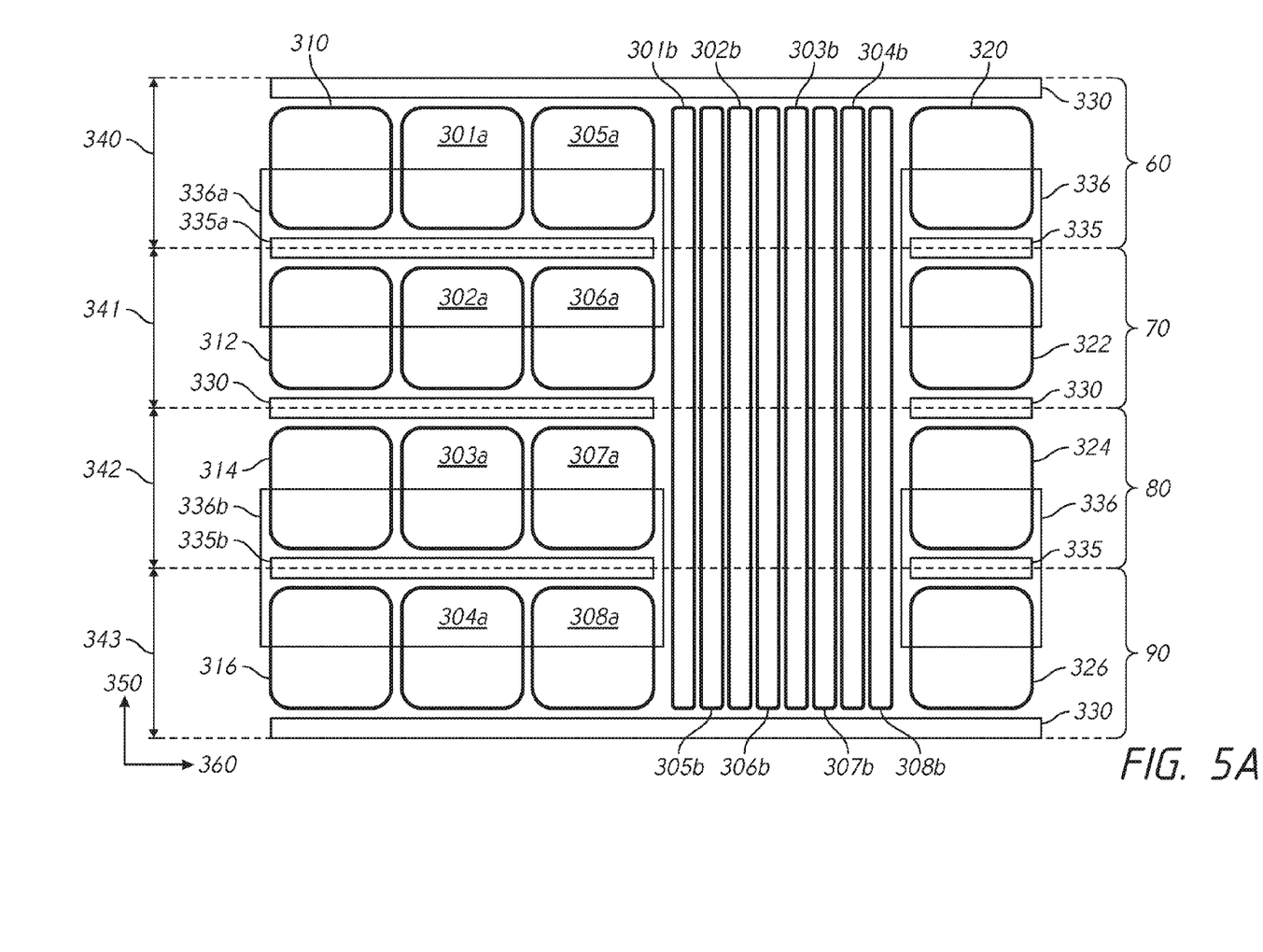
FIGS. 5A and 5B are simplified layout diagrams of logic circuits including circuit cells in accordance with an embodiment of the present disclosure.
Figure 5B:
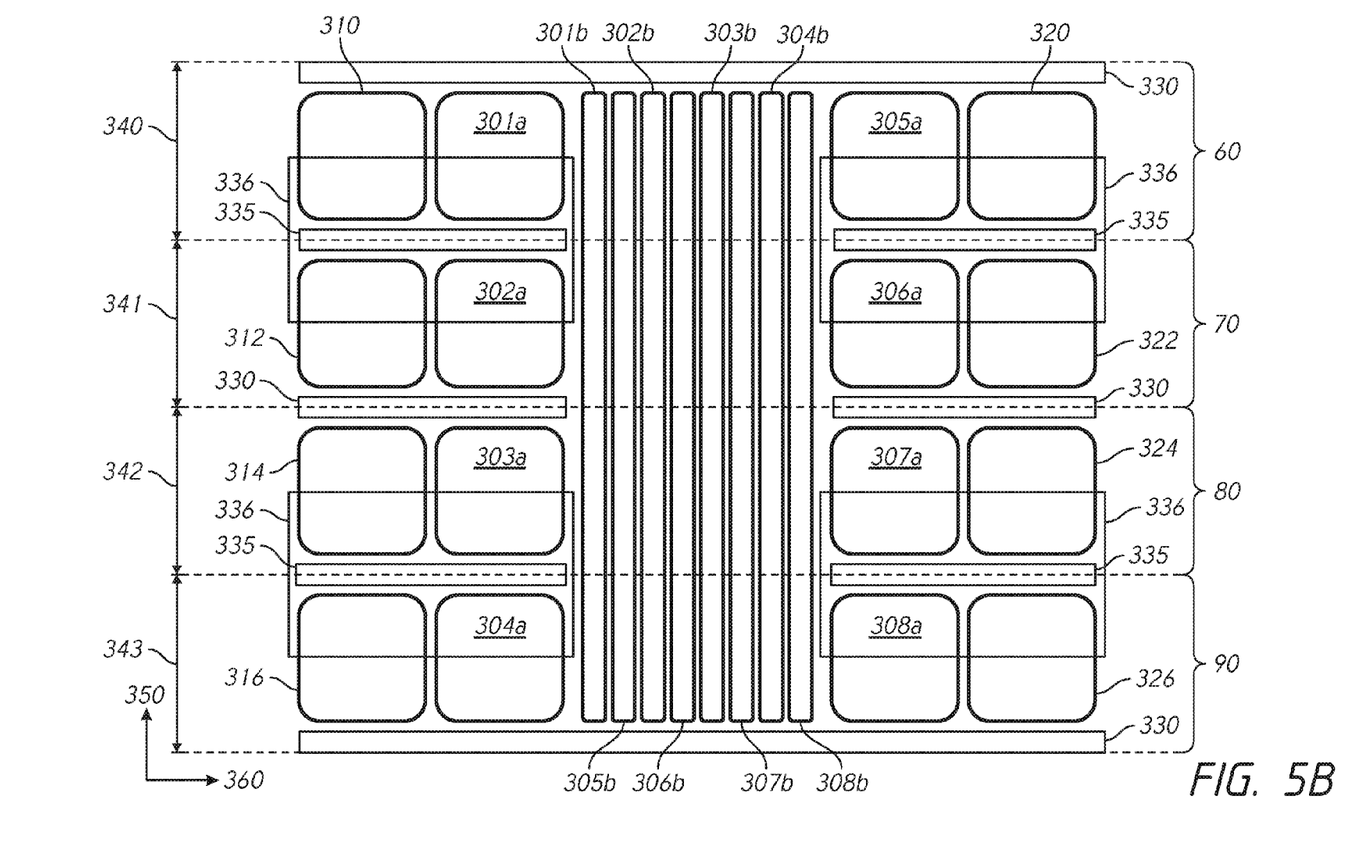

FIGS. 5A and 5B are simplified layout diagrams of logic circuits including circuit cells in accordance with an embodiment of the present disclosure. Description of components corresponding to components included in FIG. 4 will not be repeated. In FIG. 5A, transistor areas 301a and 305a and peripheral circuit blocks in circuit cells 310 and 320 are in the first layout region 60 and aligned to each other along the second direction 360. Transistor areas 302a and 306a and peripheral circuit blocks in circuit cells 312 and 322 are in the second layout region 70 and aligned to each other along the second direction 360. Transistor area 303a and 307a and peripheral circuit blocks in circuit cells 314 and 324 are in the third layout region 80 and aligned to each other along the second direction 360. Transistor area 304a and 308a and peripheral circuit blocks in circuit cells 316 and 326 are in the fourth layout region 90 and aligned to each other along the second direction 360. The transistor areas 301a, 302a, 303a and 304a are disposed along the first direction 350 across the well-contact areas 335a, 335b and the sub-contact area 330. The transistor areas 305a, 306a, 307a and 308a are also disposed along the first direction 350 across the well-contact areas 335a, 335b and the sub-contact area 330. Thus, sub-contact areas and well-contact areas may be shared by adjacent transistor areas of adjacent layout regions.

Each of eight delay circuits includes a logic circuit in its transistor area and a resistive element electrically coupled to the logic circuit. In this example, the first resistor area 301b, the fifth resistor area 305b, the second resistor area 302b, the sixth resistor area 306b, the third resistor area 303b, the seventh resistor area 307b, the fourth resistor area 304b, and the eighth resistor area 308b extend across the first layout region 60 to the fourth layout region 90 in the first direction 350. The first resistor area 301b, the fifth resistor area 305b, the second resistor area 302b, the sixth resistor area 306b, the third resistor area 303b, the seventh resistor area 307b, the fourth resistor area 304b, and the eighth resistor area 308b may be aligned between the sub-contact area 330 in the first layout region 60 and the sub-contact area 330 in the fourth layout region 90 along the second direction 360, For example, the first resistor area 301b, the fifth resistor area 305b, the second resistor area 302b, the sixth resistor area 306b, the third resistor area 303b, the seventh resistor area 307b, the fourth resistor area 304b, and the eighth resistor area 308b may be disposed outside of an area defined by the well-contact areas 335a, 335b and the sub-contact area 330. In FIG. 5A, the transistor areas 301a and 305a are adjacent to each other, the transistor areas 302a and 306a are adjacent to each other, the transistor area 303a and 307a are adjacent to each other, and the transistor area 304a and 308a are adjacent to each other. Alternatively, as shown in FIG. 5B, it is possible to have transistor areas in the same layout region across the resistor areas. For example, the transistor areas 301a and 305a, the transistor areas 302a and 306a, the transistor area 303a and 307, and the transistor area 304a and 308a are aligned along the second direction 360 in the layout region 60, 70, 80 and 90 respectively, across the first resistor area 301b, the fifth resistor area 305b, the second resistor area 302b, the sixth resistor area 306b, the third resistor area 303b, the seventh resistor area 307b, the fourth resistor area 304b, and the eighth resistor area 308b.

Channel types of transistors used in the embodiments described the above are merely examples. However, in other embodiments, combinations of the channel types of transistors other than those specifically described in the present disclosure may be used without departing from the scope of the present disclosure.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present invention herein disclosed should not be limited by the particular disclosed embodiments described above.

What is claimed is:

1. A device comprising:
   first and second CMOS areas arranged in a first direction, each of the first and second CMOS areas including n-channel and p-channel transistors; and
   a resistor area including first and second portions, the first and second portions disposed relative to the first and the second CMOS areas in a second direction, the second direction being substantially perpendicular to the first direction, and the resistor area including a resistor that extends continuously from the first portion to the second portion in the first direction.

2. The device of claim 1, further comprising:
   a first layout region extending in the second direction and including the first CMOS area and the first portion of the resistor area;
   a second layout region adjacent to the first layout region in the first direction, extending in the second direction, the second layout region including the second CMOS area and the second portion of the resistor area; and
   a second resistor area adjacent to the resistor area in the second direction, the second resistor area including a second resistor that extends continuously from the first layout region to the second layout region in the first direction.

3. The device of claim 1, further comprising a second resistor area adjacent to the first and the second CMOS areas in a third direction opposite to the second direction.

4. The device of claim 2, further comprising:
   a third CMOS area; and
   a third layout region adjacent to the second layout region in the first direction, extending in the second direction and including the third CMOS area and a third portion of the resistor area,
   wherein the resistor area extends continuously across the first layout region, the second layout region, and the third layout region.

5. The device of claim 1, further comprising a third CMOS area adjacent to the resistor area in the second direction.

6. The device of claim 1, further comprising a third CMOS area adjacent to the first CMOS area in a third direction opposite to the second direction.

7. An apparatus comprising:
   a first layout region comprising a first transistor area comprising at least one first transistor;
   at least one contact area adjacent to the first transistor area; and
   a first resistor area comprising at least one first resistor coupled to the at least one first transistor.

8. The apparatus of claim 7, wherein the at least one contact area includes one of:
   a substrate contact configured to couple the at least one first transistor to a substrate region when the at least one first transistor is an n-channel transistor; and
   a well contact configured to couple the at least one first transistor to a well region when the at least one first transistor is a p-channel transistor.

9. The apparatus of claim 7, wherein the first resistor area is outside of an area defined by the at least one contact area and the first transistor area.

10. The apparatus of claim 7, wherein the first transistor area and the at least one contact area are aligned to each other along a first direction, and wherein the first transistor area and the first resistor area are adjacent to each other along a second direction.

11. The apparatus of claim 10, he second direction is substantially perpendicular to the first direction.

12. The apparatus of claim 11, further comprising:
a second layout region adjacent to the first layout region in the first direction, the second layout region comprising:
a second transistor area comprising at least one second transistor,
wherein the first transistor area, the second transistor area, and the at least one contact are area aligned along the first direction, and
wherein the first resistor area is adjacent to the first transistor area and the second transistor area along the second direction.

13. The apparatus of claim 12, wherein the first resistor area extends across the first layout region to the second layout region in the first direction.

14. The apparatus of claim 12, further comprising:
a second resistor area comprising at least one second resistor coupled to the at least one second transistor,
wherein the second resistor area is adjacent to the first transistor area and the second transistor area along the second direction.

15. The apparatus of claim 12, further comprising:
a second resistor area comprising at least one second resistor coupled to the at least one second transistor,
wherein the second resistor area is adjacent to the first transistor area and the second transistor area along a third direction substantially opposite to the second direction.

16. The apparatus of claim 12, further comprising:
a second resistor area comprising at least one second resistor coupled to the at least one second transistor,
wherein the first resistor area is in the first layout region and the second resistor area is in the second layout region.

* * * * *

UNITED STATES PATENT AND TRADEMARK OFFICE
CERTIFICATE OF CORRECTION

PATENT NO. : 9,929,135 B2
APPLICATION NO. : 15/063117
DATED : March 27, 2018
INVENTOR(S) : Yasuhiko Tanuma et al.

It is certified that error appears in the above-identified patent and that said Letters Patent is hereby corrected as shown below:

|  | Reads | Should read |
|---|---|---|
| Column 9, Line 3 | "he second direction is" | --wherein the second direction is-- |

Signed and Sealed this
Fifteenth Day of May, 2018

Andrei Iancu
*Director of the United States Patent and Trademark Office*